United States Patent
Wang et al.

(10) Patent No.: US 9,418,853 B1
(45) Date of Patent: Aug. 16, 2016

(54) METHOD FOR FORMING A STACKED LAYER STRUCTURE

(71) Applicant: UNITED MICROELECTRONICS CORP., Hsin-Chu (TW)

(72) Inventors: Shao-Wei Wang, Taichung (TW); Keng-Jen Lin, Kaohsiung (TW); Yu-Tung Hsiao, Tainan (TW); Shu-Ming Yeh, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 2 days.

(21) Appl. No.: 14/692,736

(22) Filed: Apr. 21, 2015

(51) Int. Cl.
*H01L 21/3205* (2006.01)
*H01L 21/28* (2006.01)
*H01L 29/51* (2006.01)

(52) U.S. Cl.
CPC .... *H01L 21/28185* (2013.01); *H01L 21/28202* (2013.01); *H01L 21/28273* (2013.01); *H01L 29/517* (2013.01)

(58) Field of Classification Search
CPC .................................................. H01L 29/517
USPC ................................................... 438/591, 275
See application file for complete search history.

(56) References Cited

U.S. PATENT DOCUMENTS 7,531,404 B2 * 5/2009 Pae ............... H01L 21/28185
438/211
8,580,641 B2 * 11/2013 Lu ....................... H01L 27/1104
257/369

\* cited by examiner

*Primary Examiner* — Tuan Nguyen
(74) *Attorney, Agent, or Firm* — Winston Hsu; Scott Margo

(57) ABSTRACT

The present invention provides a method for forming a stacked layer structure, including: first, a recess is provided, next, an oxide layer is formed in the recess, where the oxide layer has a thickness T1, a high-k layer is formed on the oxide layer, a barrier layer is formed on the high-k layer, a silicon layer is then formed on the barrier layer, afterwards, an annealing process is performed on the silicon layer, so as to form an oxygen-containing layer between the silicon layer and the barrier layer, where the oxide layer has a thickness T2 after the annealing process is performed, and satisfies the relationship: $(T2-T1)/T1 \leq 0.05$, and the silicon layer and the oxygen-containing layer are removed.

14 Claims, 5 Drawing Sheets

METHOD FOR FORMING A STACKED LAYER STRUCTURE

BACKGROUND OF THE INVENTION

1. Field of the Invention

The present invention relates generally to a method for forming a stacked gate, and more specifically to a gate forming process relating to a silicon layer on a barrier layer.

2. Description of the Prior Art

With increasing miniaturization of semiconductor devices, various multi-gate MOSFET devices have been developed. The multi-gate MOSFET is advantageous for the following reasons. First, manufacturing processes of multi-gate MOSFET devices can be integrated into traditional logic device processes, and thus are more compatible. In addition, since the three-dimensional structure of the multi-gate MOSFET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased.

Poly-silicon is conventionally used as a gate electrode in semiconductor devices, such as multi-gate MOSFET devices. With the trend towards scaling down the size of semiconductor devices, however, conventional poly-silicon gates face problems such as inferior performance due to boron penetration and unavoidable depletion effect. This increases the equivalent thickness of the gate dielectric layer, reduces gate capacitance, and worsens a driving force of the devices. Therefore, work function metals that are suitable for use as a high-K gate dielectric layer are used to replace the conventional poly-silicon gate as the control electrode.

SUMMARY OF THE INVENTION

The present invention provides a method for forming a stacked layer structure, comprising: first, a recess is provided, next, an oxide layer is formed in the recess, wherein the oxide layer has a thickness T1. A high-k layer is formed on the oxide layer, a barrier layer is formed on the high-k layer, and a silicon layer is then formed on the barrier layer. Afterwards, an annealing process is performed on the silicon layer, so as to form an oxygen-containing layer between the silicon layer and the barrier layer, wherein the oxide layer has a thickness T2 after the annealing process is performed, and satisfies the relationship: $(T2-T1)/T1 \leq 0.05$, and the silicon layer and the oxygen-containing layer are removed.

The present invention further provides a method for forming a stacked layer structure, comprising: first, a recess is provided, next, an oxide layer is formed in the recess, wherein the oxide layer has an oxygen containing ratio R1. A high-k layer is formed on the oxide layer, a barrier layer is formed on the high-k layer, and a silicon layer is then formed on the barrier layer. Afterwards, an annealing process is performed on the silicon layer, so as to form an oxygen-containing layer between the silicon layer and the barrier layer, wherein the oxide layer has an oxygen containing ratio R2 after the annealing process is performed, and satisfies the relationship: $(R2-R1)/R1 \leq 0.03$, and the silicon layer and the oxygen-containing layer are removed.

A key feature of the present invention is that as the silicon layer is directly formed on the barrier layer, and oxygen atoms from the barrier layer will move toward the silicon layer. As the annealing process is performed, ingredients in the barrier layer and the silicon layers can react with each other, so as to form the oxygen-containing layer such that titanium silicon dioxide ($TiSiO_2$) and titanium oxynitride (TiON) between the barrier layer and the silicon layer, after the oxygen-containing layer is removed, the oxygen concentration of the barrier layer and the buffer layer can be decreased, thereby avoiding the EOT of the device being increased.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
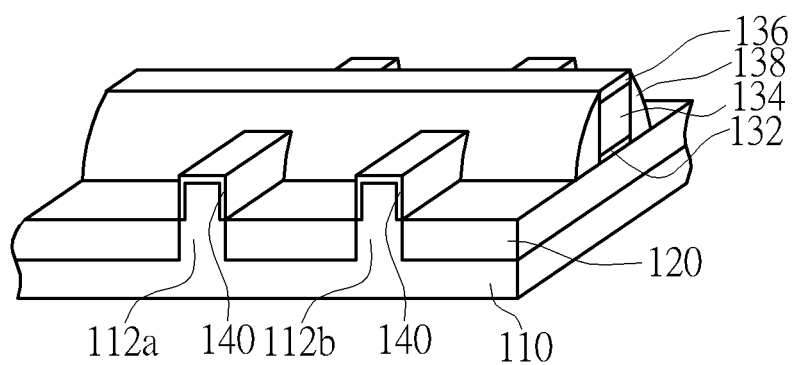
FIGS. 1-2 schematically depict 3-dimensional diagrams of a gate forming process according to one embodiment of the present invention.
Figure 2:
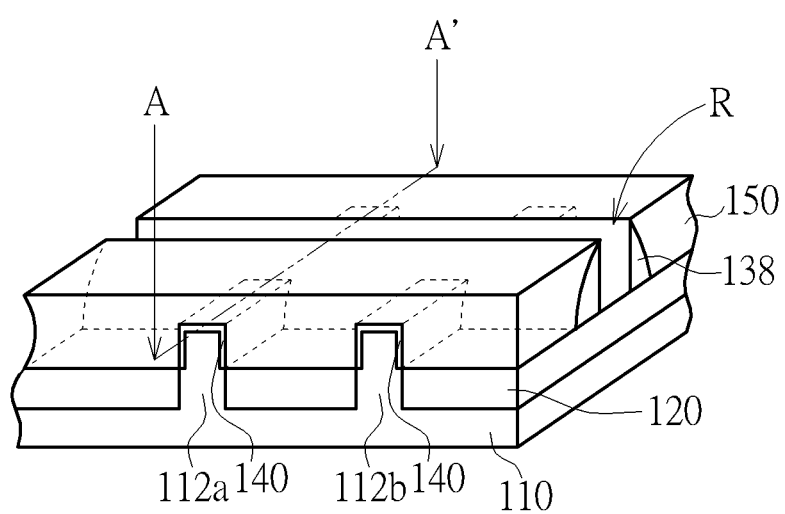

FIGS. 1-2 schematically depict 3-dimensional diagrams of a gate forming process according to one embodiment of the present invention. As shown in FIG. 1, a substrate 110 is provided. Two fin-shaped structures 112a/112b are formed on the substrate 110. More precisely, the method of forming the fin-shaped structures 112a/112b may include the following steps. A bulk substrate (not shown) is provided. A hard mask (not shown) is formed thereon. The hard mask (not shown) is patterned to define the locations of the fin-shaped structures 112a/112b in the substrate 110. An etching process is performed on the bulk substrate (not shown) so that the fin-shaped structures 112a/112b are formed. The fabrication of the fin-shaped structures 112a/112b on the substrate 110 is then finished. Two fin-shaped structures 112a/112b are depicted in this embodiment, but the present invention can also be applied to other numbers of fin-shaped structures 112a/112b or applied to a planar FET (without any fin structure).

An isolation structure 120 is formed on the substrate 110 between the fin-shaped structures 112a/112b. The isolation structure 120 may be a shallow trench isolation (STI) structure, which may be formed by a shallow trench isolation (STI) process, but is not limited thereto. In one embodiment, the hard mask (not shown) is removed after the fin-shaped structures 112a/112b are formed, and a tri-gate MOSFET can be formed in the following processes. There are three contact faces between each of the fin-shaped structures 112a/112b and the later formed dielectric layer, and are used as a carrier channel whose width is wider than a channel width of a conventional planar MOSFET. When a driving voltage is applied, the tri-gate MOSFET produces an on-current two times higher compared to the conventional planar MOSFET. In another embodiment, the hard mask layer (not shown) is reserved to form another kind of multi-gate MOSFET. Due to the hard mask layer (not shown) being reserved, there are only two contact faces between each of the fin-shaped structures 112a/112b and a later formed dielectric layer.

The present invention can also be applied to other semiconductor substrates. For example, a silicon-on-insulator substrate (not shown) is provided, and then a single crystalline silicon layer being a top part of the silicon-on-insulator substrate (not shown) is etched until an oxide layer being a middle part of the silicon-on-insulator substrate (not shown) is exposed, meaning that the fin-shaped structure formed on the silicon-on-insulator substrate (not shown) is finished.

After the fin-shaped structures 112a/112b are formed, a dielectric layer (not shown), an electrode layer (not shown) and a cap layer (not shown) are formed across the fin-shaped structures 112a/112b and then three of them are patterned to form a dielectric layer 132, an electrode layer 134 and a cap layer 136. A spacer 138 is formed beside the dielectric layer 132, the electrode layer 134 and the cap layer 136. A source/drain region 140 may be respectively formed on each of the fin-shaped structures 112a/112b beside the spacer 138 by methods such as an inclination ion implantation process. A lightly source/drain region (not shown) or/and an epitaxial structure (not shown) may also be respectively formed on each of the fin-shaped structures 112a/112b beside the spacer 138 before/after the source/drain region 140 is formed.

In this embodiment, a gate forming process of the present invention is applied to a gate-last for high-k last process. Therefore, the dielectric layer 132 may be an oxide layer; the electrode layer 134 is a polysilicon layer but will be replaced by a metal layer in subsequent processes; the cap layer 136 and the spacer 138 may be single layer or multilayer composed of nitride layers or oxide layers, but they are not limited thereto. In a modification, the present invention can also be applied to a gate-last for high-k first process or a gate-first process etc., and the high-k layer and the electrode layer 134 are therefore formed with suitable dielectric materials or metal materials.

Thereafter, an interdielectric layer (not shown) is formed and covers the substrate 110, the fin-shaped structures 112a/112b, the spacer 138 and the cap layer 136. Then, the interdielectric layer (not shown) is planarized to form an interdielectric layer 150. The planarization process may include a chemical mechanical polishing (CMP) process or an etching process, but is not limited thereto. As the planarization process is performed, the cap layer 136 is also removed to expose the electrode layer 134. Then, the electrode layer 134 and the dielectric layer are removed and a recess R is thereby formed, as shown in FIG. 2. In following processes, metal materials will be filled into the recess R on each of the fin-shaped structures 112a/112b to form a multi-gate MOSFET. The fin-shaped structures 112a/112b include common metal layers in this embodiment, but they may include different metal layers in other embodiments. For clarifying the present invention, FIGS. 3-9 schematically depict cross-sectional views of a gate forming process along AA' sectional line of FIG. 2.

Figure 3:
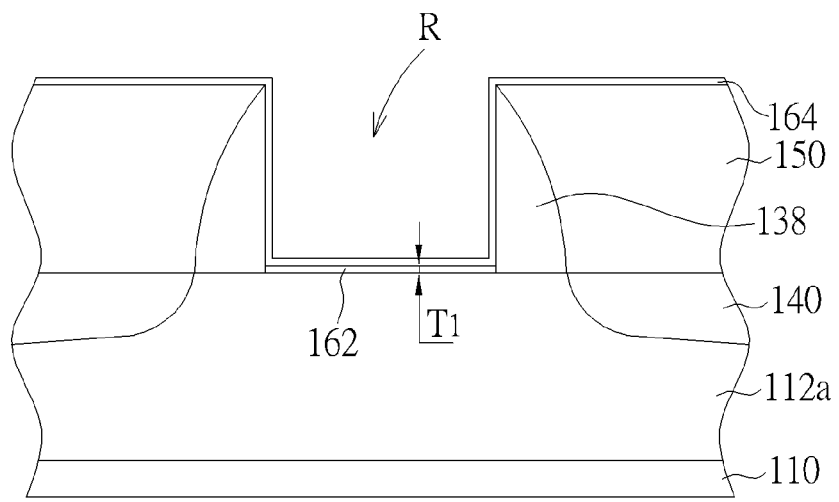
FIGS. 3-9 schematically depict cross-sectional views of a gate forming process along AA' sectional line of FIG. 2.

As shown in FIG. 3, the spacer 138 and the interdielectric layer 150 are respectively formed across the fin-shaped structure 112a. The source/drain region 140 is formed in the fin-shaped structure 112a beside the spacer 138. The spacer 138 surrounds a recess R, which exposes parts of the fin-shaped structure 112a. Then, a buffer layer 162 may be formed on the fin-shaped structure 112a and then a high-k layer 164 may be formed on the fin-shaped structure 112a. The buffer layer 162 may be an oxide layer, having a thickness T1. In this embodiment, the thickness is about 6-8 angstroms, but not limited thereto. The high-k layer 164 may be a dielectric layer having a high dielectric constant, such as the group selected from hafnium oxide ($HfO_2$), hafnium silicon oxide (HfSiO4), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST), but is not limited thereto.

Figure 4:
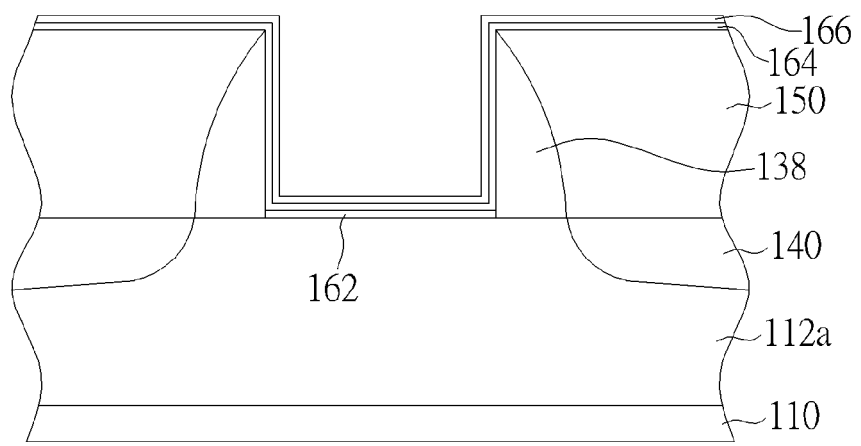

As shown in FIG. 4, a barrier layer 166 is formed on the gate dielectric layer 164, wherein the barrier layer 166 may be a titanium nitride layer or a tantalum nitride layer, but is not limited thereto. In this embodiment, the barrier layer 166 is a bottom barrier layer, and the barrier layer 166 may be a titanium nitride layer, or be a titanium oxide nitride (TiON) layer while the titanium nitride layer absorbs the oxygen atoms from the air.

Figure 5:
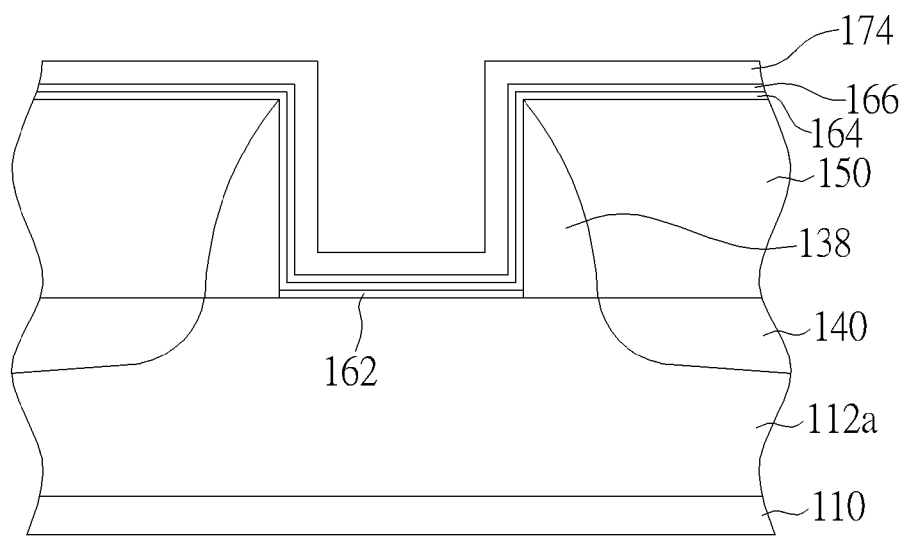

As shown in FIG. 5, a silicon layer 174 is formed on the barrier layer 166. In this embodiment, silicon layer 174 is directly formed on the barrier layer 166 to absorb oxygen atoms in the barrier layer 166. The silicon layer 174 may be formed by precursors including silane. As the silicon layer 174 is deposited, oxygen atoms in the barrier layer 166 not only move toward the gate dielectric layer 164 and the buffer layer 162 but also toward the silicon layer 174, and especially become trapped at the interface of the silicon layer 174 and the barrier layer 166. As more oxygen atoms are trapped by the silicon layer 174, less oxygen atoms will diffuse toward the gate dielectric layer 164 and the buffer layer 162. The silicon layer 174 is preferably an amorphous silicon layer to generate more dangling bonds and trap more oxygen atoms.

Preferably, the silicon layer 174 is formed by a chemical vapor deposition process or an atomic layer deposition process, but this is not limited thereto. In one case, the silicon layer 174 is formed by a chemical vapor deposition process, wherein the processing temperature of the chemical vapor deposition process is preferably between 360° C.-620° C. Still preferably, the processing temperature of the chemical vapor deposition process is 380° C. As the processing temperature is lower than 360° C., the depositing of the silicon layer 174 is difficult; as the processing temperature is higher than 620 t, oxygen atoms in the barrier layer 166 would be induced downward to the gate dielectric layer 164 and the buffer layer 162. Thereby, an equivalent oxide thickness (EOT) of a formed device is better as the processing temperature of the chemical vapor deposition process is at a suitable processing temperature such as in a range of 360° C.-620° C.

Since oxygen atoms are easier to diffuse toward a silicon surface and combine with silicon, the distribution of oxygen concentration approaches peak values at the interfaces of the barrier layer 166 and the silicon layers 174. In addition, the silicon layers 174 can be a multiple layer structure. Therefore, more than two interfaces between the silicon layers 174 are formed which can trap more oxygen atoms in the barrier layer 166 than only one interface of the barrier layer 166 and one single silicon layer 174. Hence, more oxygen atoms in the barrier layer 166 can move toward the interfaces between the barrier layer 166 and the silicon layer 174 and be trapped in the interfaces between therein. Less oxygen atoms will move toward the gate dielectric layer 164, thereby improving processing yields and reliability.

Figure 6:
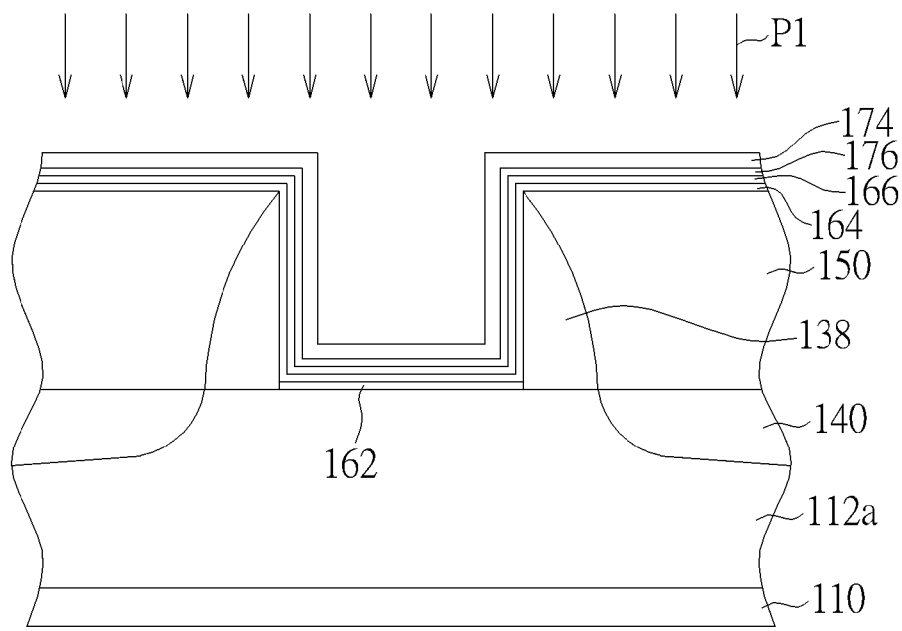

As shown in FIG. 6, an annealing process P1 may be performed after the silicon layers 174 is formed. As the annealing process P1 is performed, ingredients such as oxygen, titanium and nitrogen in the barrier layer 166 of this embodiment will react with silicon of the silicon layers 174, so as to form an oxygen-containing layer 176 between the silicon layer 174 and the barrier layer 166, wherein the oxygen-containing layer 176 may be a titanium silicon dioxide ($TiSiO_2$) layer or a titanium oxynitride (TiON) layer, but is not limited thereto.

In this embodiment, one single annealing process P1 is performed immediately after the silicon layer 174 is formed. In one case, the annealing process P1 is a rapid thermal processing (RTP) process, but is not limited thereto. Preferably, the annealing temperature of the annealing process P1 is between 900° C.-1200. Still preferably, the annealing temperature of the annealing process P3 is 970° C.

Figure 7:
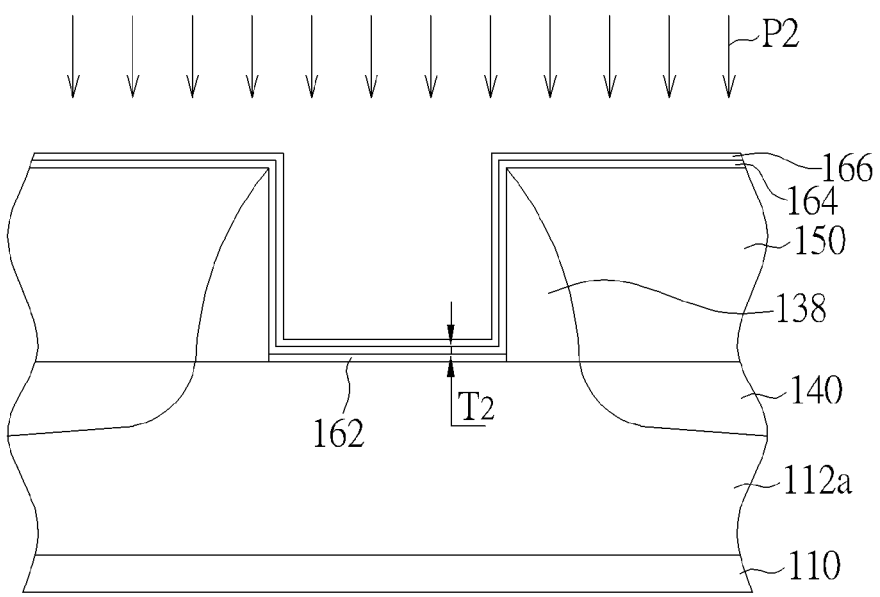

Thereafter, as shown in FIG. 7, the oxygen-containing layer 176 and the silicon layer 174 are removed, and a nitridation process P2 is then performed on the barrier layer 166 in the recess R (shown in FIG. 3), so as to strengthen the profile of the stacked layers structure (including the a buffer layer 162, the high-k layer 164 and the barrier layer 166), wherein the nitridation process P2 comprises a decoupled plasma nitridation (DPN) processor an ammonia heating process (a heating process with $NH_3$ gas).

It is noteworthy that according to the experiment of the applicant, since the process for forming the silicon layer 174 is further added during the manufacturing process, after the annealing process P1 and the nitridation process P2 are performed, the thickness of the buffer layer 162 and the oxygen containing ratio of the buffer layer 162 is hardly changed. Otherwise, the thickness and the oxygen containing ratio of the buffer layer 162 will be increased, thereby influencing the equivalent oxide thickness (EOT) of the device.

More precisely, the buffer layer 162 has a thickness T1 before the annealing process P1 is performed, and the buffer layer 162 has a thickness T2 after the annealing process P1 and the nitridation process P2 are performed, the thickness T2 is almost same as the thickness T1, and the relationship of $(T2-T1)/T1 \leq 0.05$ is satisfied. Besides, the buffer layer 162 has an oxygen containing ratio R1 before the annealing process P1 is performed, and the buffer layer 162 has an oxygen containing ratio R2 after the annealing process P1 and the nitridation process P2 are performed, wherein the relationship of $(R2-R1)/R1 \leq 0.03$ is further satisfied.

According to the experiment of the applicant, the thickness T1 of the buffer layer 162 is about 7.64 angstroms, and the thickness T2 of the buffer layer 162 is hardly changed. However, if the silicon layer 174 is not formed during the manufacturing process, more oxygen atoms will diffuse toward the gate dielectric layer 164 and the buffer layer 162, and thereby the thickness of the buffer layer 162 will be increased after the nitridation process P2 is performed. According to the experiment of the applicant, the thickness of the buffer layer will changed from 7.64 angstroms to 13.6 angstroms if the nitridation process P2 is an ammonia ($NH_3$) heating process; the thickness of the buffer layer will changed from 7.64 angstroms to 10.6 angstroms if the nitridation process P2 is a DPN process. In summary, if the silicon layer 174 is not formed during the manufacturing process, the thickness of the buffer layer will at least increased 30% or more, and influence the equivalent oxide thickness (EOT) of the device.

Furthermore, in the present invention, the oxygen containing ratio of the buffer layer 162 is hardly changed either after the nitridation process P2 is performed. According to the experiment of the applicant, the oxygen containing ratio of the buffer layer 162 is changed from 37.48% to 37.77% after 10 hours have passed, which means it is increased less than 3%. However, if the silicon layer 174 is not formed during the manufacturing process, the oxygen containing ratio of the buffer layer 162 is changed from 32.92% to 36.46% after 10 hours have passed. In other words, the oxygen containing ratio is increased about 10%. In summary, the present invention further forms the silicon layer on the barrier layer, thereby avoiding the issue of the increasing of the EOT of the device.

Figure 8:
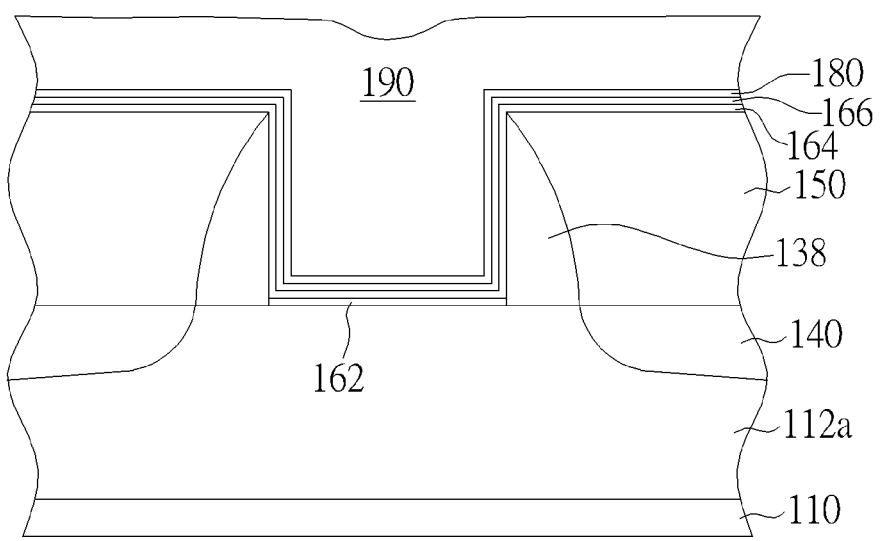
Figure 9:
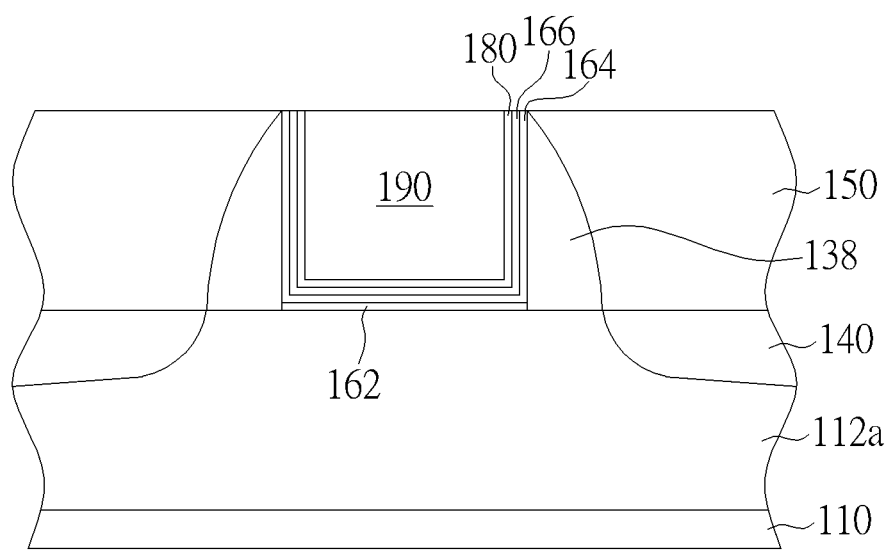

Then, as shown in FIG. 8, at least one work function metal layer 180 may be formed on the barrier layer 166. A top barrier layer (not shown) may be formed after/before, or after and before the work function metal layer 180 is formed. The work function metal layer 180 may be a single layer or a multilayer structure, such as a p-type work function layer or an n-type work function layer, for example, it may composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN) etc. The top barrier layer may be a single layer or a multilayer structure composed of tantalum nitride (TaN) or titanium nitride (TiN). A low resistivity material 190 may cover the work function metal layer 180 and fill up the recess R (shown in FIG. 3). The low resistivity material 190 may be composed of low resistivity materials such as aluminum, tungsten, titanium aluminum (TiAl) alloy, or cobalt tungsten phosphide (CoWP). Afterwards, as shown in FIG. 9, an planarization process such as chemical mechanical polishing (CMP) can be performed, so as to complete the gate structure. Sequential semiconductor processes such as interconnects or other processes for forming the above layers may then be performed.

A key feature of the present invention is that as the silicon layer is directly formed on the barrier layer, oxygen atoms from the barrier layer will move toward the silicon layer. As the annealing process is performed, ingredients in the barrier layer and the silicon layers can react with each other, so as to form the oxygen-containing layer such that titanium silicon dioxide ($TiSiO_2$) and titanium oxynitride (TiON) between the barrier layer and the silicon layer, after the oxygen-containing layer is removed, the oxygen concentration of the barrier layer and the buffer layer can be decreased, thereby avoiding the EOT of the device being increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a stacked layer structure, comprising:
    providing a recess;
    forming an oxide layer in the recess, wherein the oxide layer has a thickness T1;
    forming a high-k layer on the oxide layer;
    forming a barrier layer on the high-k layer;
    forming a silicon layer on the barrier layer;
    performing an annealing process on the silicon layer, so as to form an oxygen-containing layer between the silicon layer and the barrier layer, wherein the oxide layer has a thickness T2 after the annealing process is performed, and satisfies the relationship: $(T2-T1)/T1 \leq 0.05$; and
    removing the silicon layer and the oxygen-containing layer.

2. The method of claim 1, further comprising providing a substrate, and the recess is disposed within the substrate.

3. The method of claim 1, further comprising performing a nitridation process after the silicon layer and the oxygen-containing layer are removed.

4. The method of claim 3, wherein the nitridation process comprises a decoupled plasma nitridation (DPN) process or an ammonia heating process.

5. The method of claim 1, further comprising forming a work-function layer on the barrier layer after the silicon layer and the oxygen-containing layer are removed.

6. The method of claim 5, wherein the work function layer comprises a p-type work function layer or a n-type work function layer.

7. The method of claim 1, wherein the temperature of the annealing process is between 360° C.-620° C.

8. A method for forming a stacked layer structure, comprising:

provide a recess;

forming an oxide layer in the recess, wherein the oxide layer has an oxygen containing ratio R1;

forming a high-k layer on the oxide layer;

forming a barrier layer on the high-k layer;

forming a silicon layer on the barrier layer;

performing an annealing process on the silicon layer, so as to form an oxygen-containing layer between the silicon layer and the barrier layer, wherein the oxide layer has an oxygen containing ratio R2 after the annealing process is performed, and satisfies the relationship: $(R2-R1)/R1 \leq 0.03$; and removing the silicon layer and the oxygen-containing layer.

9. The method of claim 8, further comprising providing a substrate, and the recess is disposed within the substrate.

10. The method of claim 8, further comprising performing a nitridation process after the silicon layer and the oxygen-containing layer are removed.

11. The method of claim 10, wherein the nitridation process comprises a decoupled plasma nitridation (DPN) processor an ammonia heating process.

12. The method of claim 8, further comprising forming a work-function layer on the barrier layer after the silicon layer and the oxygen-containing layer are removed.

13. The method of claim 12, wherein the work function layer comprises a p-type work function layer or an n-type work function layer.

14. The method of claim 8, wherein the temperature of the annealing process is between 360° C.-620° C.

* * * * *